United States Patent
Akbar et al.

(10) Patent No.: US 6,664,179 B2
(45) Date of Patent: Dec. 16, 2003

(54) SEMICONDUCTOR DEVICE PRODUCTION METHOD AND SEMICONDUCTOR DEVICE PRODUCTION APPARATUS

(75) Inventors: Ade Asneil Akbar, Kawasaki (JP); Takayuki Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/223,456

(22) Filed: Aug. 20, 2002

(65) Prior Publication Data

US 2003/0136423 A1 Jul. 24, 2003

(30) Foreign Application Priority Data

Jan. 18, 2002 (JP) ........................................ 2002-009785

(51) Int. Cl.$^7$ .......................................... H01L 21/4763
(52) U.S. Cl. ...................... 438/635; 438/658; 438/660; 438/687; 438/722; 438/742; 438/754; 438/768; 438/785; 438/906
(58) Field of Search ................................ 438/635, 658, 438/660, 687, 722, 742, 754, 768, 785, 906

(56) References Cited

U.S. PATENT DOCUMENTS

| | | |
|---|---|---|
| 2001/0020478 A1 | 9/2001 | Kojima et al. |
| 2002/0098685 A1 * | 7/2002 | Sophie et al. ............ 438/633 |
| 2002/0119651 A1 * | 8/2002 | Noguchi et al. ............ 438/687 |
| 2003/0001277 A1 * | 1/2003 | Noguchi et al. ............ 438/687 |

FOREIGN PATENT DOCUMENTS

| | | |
|---|---|---|
| JP | 2001-271192 | 10/2001 |
| JP | 2002-270609 | 9/2002 |

OTHER PUBLICATIONS

Patent Abstracts of Japan, Publication No. 2001–254178 dated Sep. 18, 2001 Discussed in the specification.

* cited by examiner

*Primary Examiner*—John F. Niebling
*Assistant Examiner*—Lynne Gurley
(74) *Attorney, Agent, or Firm*—Armstrong, Westerman & Hattori, LLP

(57) ABSTRACT

A semiconductor device production method that is used to uniformly and efficiently reduce metal oxides produced on metal (copper, for example) which forms electrodes or wirings on a semiconductor device. An object to be treated on which copper oxides are produced is put into a process chamber and is heated by a heater to a predetermined temperature. Then carboxylic acid stored in a storage tank is vaporized by a carburetor. The vaporized carboxylic acid, together with carrier gas, is introduced into the process chamber via a treating gas feed pipe to reduce the copper oxides produced on the object to be treated to metal copper. As a result, metal oxides can be reduced uniformly without making the surfaces of electrodes or wirings irregular. Moreover, in this case, carbon dioxide and water are both produced in a gaseous state. This prevents impurities from remaining on the surface of copper.

5 Claims, 12 Drawing Sheets

SEMICONDUCTOR DEVICE PRODUCTION METHOD AND SEMICONDUCTOR DEVICE PRODUCTION APPARATUS

This application is based on Japanese Patent Application 2002-009785 filed on Jan. 18, 2002, the entire contents of which are incorporated herein by reference.

BACKGROUND OF THE INVENTION (1) Field of the Invention

This invention relates to a semiconductor device production method and semiconductor device production apparatus and, more particularly, to a semiconductor device production method and semiconductor device production apparatus for performing a cleaning process to reduce metal oxides produced on metal which forms electrodes or wirings on a semiconductor device.

(2) Description of the Related Art

Conventionally, aluminum has widely been used as material for electrodes and wirings on semiconductor devices. However, in recent years demands for minute semiconductor devices and high-speed processing have made it difficult to form electrodes and wirings with aluminum. For this reason attempts to use copper, which can withstand electromigration and the resistivity value of which is small, as next generation material which replaces aluminum are being made.

If copper is used as material for electrodes and wirings, then electrodes and wirings will be formed by a damascene method because it is hard to etch copper. In this case, minute semiconductor devices and high-speed processing can be realized by increasing the aspect ratios of electrodes and wirings formed.

By the way, copper used in this way as material for electrodes and wirings is oxidized easily. When semiconductor devices are in the process of being manufactured, a copper oxide, such as cupric oxide (CuO) or cuprous oxide ($Cu_2O$), may be produced on copper formed on them as electrodes and wirings. These copper oxides will cause, for example, an increase in electrical resistance, resulting in degradation in the characteristics of semiconductor devices. Therefore, a cleaning process for eliminating copper oxides which have been produced is performed after electrodes or wirings are formed.

Methods performed in a vapor or liquid phase have been discussed or put to practical use as the process of cleaning electrodes or wirings. In the process for manufacturing semiconductor devices, this cleaning process is performed as a process after a chemical mechanical polishing (CMP) process performed after lower layer wirings of copper being formed. This cleaning process is also performed as a process after a CMP process performed after copper being embedded in via holes for buried electrodes formed in an insulating layer, which lead to lower layer wirings, or trenches for wirings formed in the insulating layer. In some cases, this cleaning process is performed as a process before a physical vapor deposition (PVD) or chemical vapor deposition (CVD) process performed on via holes or trenches.

If a cleaning process is performed as a process after a CMP process, usually particles are eliminated with a brush scrubber and copper oxides produced on an insulating layer and copper oxides produced on copper embedded in via holes or trenches are eliminated with a chemical. In this case, a chemical which eliminates copper oxides and which has a weak etching action on metal copper will be selected. For example, carboxylic acid, such as citric acid ($C_3H_4(OH)(COOH)_3$) or oxalic acid ($(COOH)_2$), hydrofluoric acid (HF), or the like will be used as a chemical.

If a cleaning process is performed as a process before a PVD process, then the cleaning process will be performed before barrier metal being deposited by PVD in via holes leading to lower layer wirings. Then copper seeds are deposited by PVD in the via holes where the barrier metal has been deposited. Copper is embedded on the copper seeds in the via holes by plating. As a result, buried electrodes which connect with lower layer wirings are formed. That is to say, a cleaning process at this stage will improve electrical reliability between lower layer wirings and copper, which forms buried electrodes, via barrier metal.

If a cleaning process is performed as a process before a CVD process, then the cleaning process will be performed after a CMP process, which is performed after copper being embedded in via holes for buried electrodes, and before a silicon nitride (SiN) film or the like of several-hundred-nanometer thickness being formed by CVD. This silicon nitride film formed prevents copper from diffusing from lower layer wirings or buried electrodes into an insulating layer and prevents the copper from oxidizing.

If a cleaning process is performed in this way as a process before a PVD or CVD process, argon sputtering is often used to perform the cleaning process.

Moreover, Japanese Patent Laid-Open Publication No. 2001-271192 discloses the method of eliminating copper oxides by causing water vapor or acetic acid to act on them.

Furthermore, Japanese Patent Laid-Open Publication No. 2001-254178 discloses the method of eliminating a metal film which has adhered to the process chamber of, for example, a CVD system by causing cleaning gas which contains carboxylic acid or its derivative to act on it and by making the metal complexes.

However, the following problems arose as to conventional cleaning processes.

With a cleaning process performed as a process after a CMP process, particles are eliminated and copper oxides are eliminated with a chemical. Then cleaning with deionized water is performed to eliminate a residual chemical. In this cleaning with deionized water, however, with a gradual elimination of a chemical, acid cleaning water becomes neutral and its pH value becomes greater. As a result, copper which forms buried electrodes and wirings is corroded.

If the concentration of a chemical is high and the pH value of cleaning water is small, then the exposed surfaces of buried electrodes and wirings are corroded slightly. However, if the concentration of a chemical is low and the pH value of cleaning water is great, then copper which forms buried electrodes and wirings is corroded locally and their surfaces become irregular. It therefore is difficult to keep the exposed surfaces of buried electrodes and wirings flat.

With a cleaning process performed as a process before a PVD process, a physical elimination method using argon sputtering enables a process in a vapor phase without using a chemical. However, contaminants once eliminated may adhere again to lower layer wirings which are exposed at the bottom of via holes formed so that they will lead to the lower layer wirings. Moreover, the edge portions of via holes are lost by sputtering, so minute buried electrodes cannot be formed.

With a cleaning process performed as a process before a CVD process, a shift from a CMP process to the CVD process needs a semiconductor device movement between process systems. As a result, copper which forms wirings is exposed to the air and there is a strong possibility that copper is oxidized.

Therefore, in this case, plasma treatment with reducing gas, such as hydrogen ($H_2$) or ammonia ($NH_3$), is performed as pretreatment in a CVD system before a silicon nitride film is formed by CVD. However, this plasma treatment must be performed in a high-temperature environment (at a temperature of about 400° C.). Therefore, exposed copper recrystallizes due to heat and a copper surface may become irregular. When after that an insulating material, such as a silicon nitride, is deposited, a coating of the insulating material deteriorates locally.

With a conventional cleaning process using gaseous acetic acid, copper oxides can be eliminated by a vapor phase reaction without using a chemical. However, another process with water vapor must be performed to eliminate contaminants, such as carbonaceous ones, which will remain on a copper surface after a cleaning process. As a result, a treatment process becomes complex.

SUMMARY OF THE INVENTION

The present invention was made under the background circumstances as described above. An object of the present invention is to provide a semiconductor device production method and semiconductor device production apparatus for performing a cleaning process by uniformly and efficiently reducing metal oxides produced on metal which forms electrodes or wirings on a semiconductor device.

In order to achieve the above object, a semiconductor device production method for performing a cleaning process to reduce metal oxides produced on metal which forms electrodes or wirings on a semiconductor device is provided. This semiconductor device production method comprises the step of performing a vapor phase cleaning process to reduce the metal oxides to metal and produce gaseous carbon dioxide and water by introducing gaseous carboxylic acid into a process chamber in which the semiconductor device is located.

Moreover, in order to achieve the above object, a semiconductor device production apparatus for performing a cleaning process to reduce metal oxides produced on metal which forms electrodes or wirings on a semiconductor device is provided. This semiconductor device production apparatus comprises a process chamber including a process table on which the semiconductor device is placed and a heater located beneath the process table for heating the semiconductor device, a storage tank for storing carboxylic acid which reduces the metal oxides, a treating gas feed pipe located between the process chamber and the storage tank, and a carburetor located along the treating gas feed pipe for vaporizing carboxylic acid which flows through the treating gas feed pipe from the storage tank to the process chamber.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
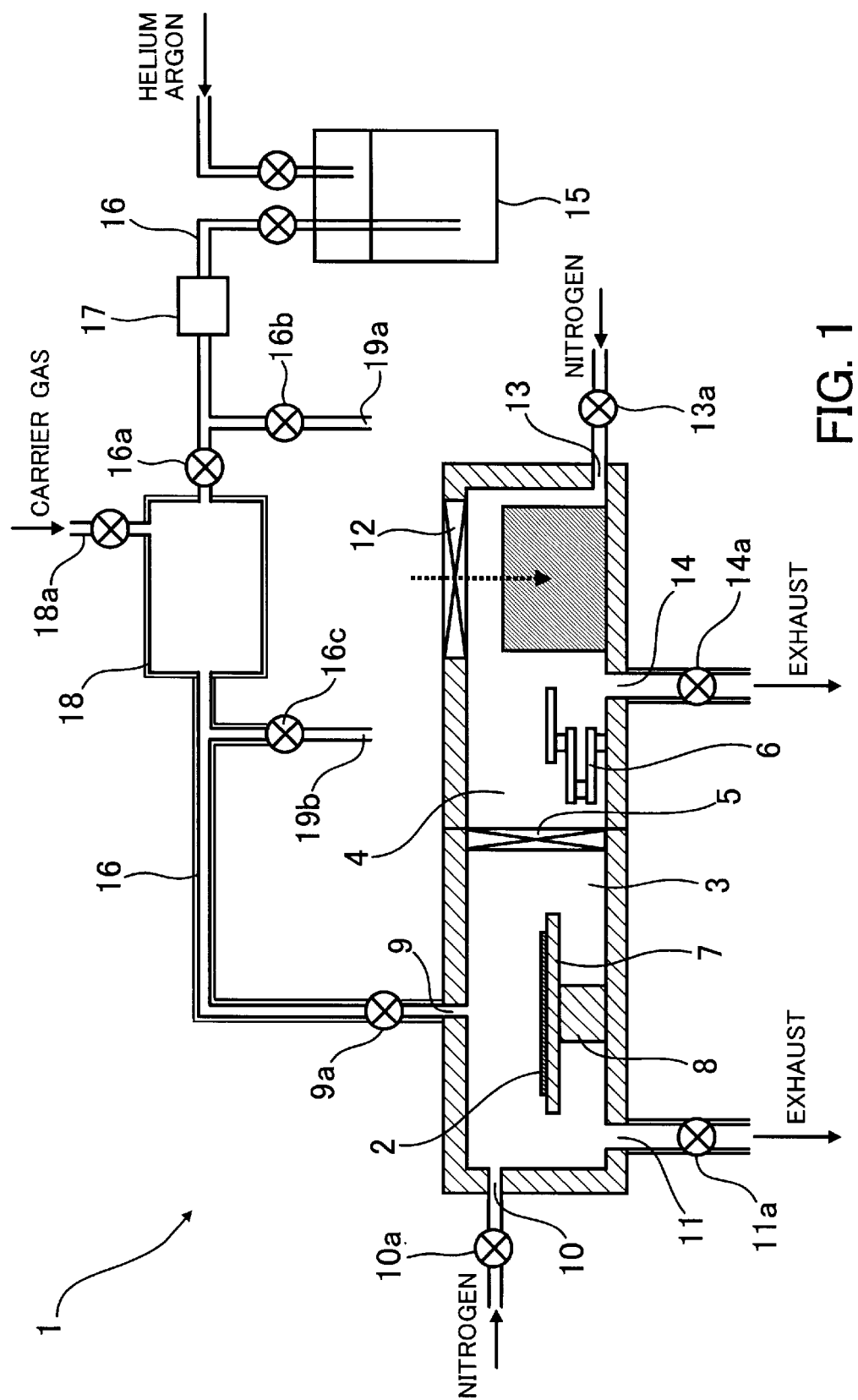
FIG. 1 is a schematic view of a vapor phase cleaning process apparatus.

Embodiments of the present invention will now be described with reference to the drawings.

First, a vapor phase cleaning process in a semiconductor device production method according to the present invention will be described. In the present invention, a copper oxide, such as cupric oxide or cuprous oxide, produced on copper which forms electrodes and wirings is reduced by the use of gaseous carboxylic acid (RCOOH where R=H, $C_nH_{2n+1}$, $C_nH_mX_{2n-m+1}$, where n and m are natural numbers and X=F, Cl) during a process for producing semiconductor devices.

Carboxylic acid acts on a copper oxide as a reducing agent. That is to say, carboxylic acid reduces a copper oxide to metal copper (Cu) and produces carbon dioxide ($CO_2$) and water ($H_2O$). For example, if formic acid (HCOOH), which is also referred to as methanoic acid, is used as carboxylic acid, then cupric oxide and cuprous oxide are reduced to metal copper on the basis of the reaction formulas $HCOOH+CuO \rightarrow Cu+CO_2+H_2O$ and $HCOOH+Cu_2O \rightarrow 2Cu+CO_2+H_2O$ respectively.

If $H_2O$ produced on the basis of the above reaction formulas is gaseous, then standard Gibbs' energy for reactions in which cupric oxide and cuprous oxide are reduced by the use of formic acid is about −132 kJ/mol and −112 kJ/mol respectively. This means that these reducing reactions are apt to progress in the direction of generating metal copper. Therefore, by performing a process at a reducing temperature at which these reactions progress in this direction, cupric oxide or cuprous oxide produced on electrodes and wirings during a process for producing semiconductor devices can be reduced.

With silicon dioxide ($SiO_2$), being a semiconductor substrate on which electrodes and wirings are formed, standard Gibbs' energy for the reaction formula $HCOOH+SiO_2 \rightarrow Si+CO_2+H_2+O_2$ is about +825 kJ/mol, so silicon dioxide will hardly be reduced by formic acid. As a result, cupric oxide or cuprous oxide will selectively be reduced.

It is preferable that the boiling point of carboxylic acid used as a reducing agent should be comparatively low. In addition to the above formic acid, such carboxylic acid includes acetic acid ($CH_3COOH$), which is also referred to as ethanoic acid, propionic acid ($C_2H_5COOH$), which is also referred to as propanoic acid, and butyric acid ($C_3H_7COOH$), which is also referred to as butanoic acid. By using such carboxylic acid, reducing temperature included in conditions for a reducing reaction described later can be lowered. This prevents irregularities of the surface of copper caused by exposure to a high temperature. Moreover, if the amount of carbon contained in carboxylic acid increases, the amount of carbon dioxide produced by reaction also increases. As a result, there is a stronger possibility that carbonaceous contaminants remain on the surface of copper or silicon dioxide. It therefore is preferable that carboxylic acid should contain a small amount of carbon. If formic acid is used as a reducing agent, reaction will progress most quickly.

Furthermore, to lower reducing temperature, a kind of carboxylic acid which contains at least one fluorine (F) or chlorine (Cl) element as a component can be used. The boiling point of carboxylic acid which contains such an element is also lower than that of carboxylic acid which does not contain such an element, so the same effect can be obtained. For example, the above formic acid is liquid under the conditions of the ordinary temperature and ordinary pressure and the boiling point is 100.8° C. The boiling point of carboxylic acid which contains a fluorine or chlorine element is lower than 100.8° C. If carboxylic acid contains fluorine or chlorine as a component, the fluorine or chlorine will be produced as hydrogen fluoride (HF) or hydrogen chloride (HCl) by a reducing reaction.

Figure 2:
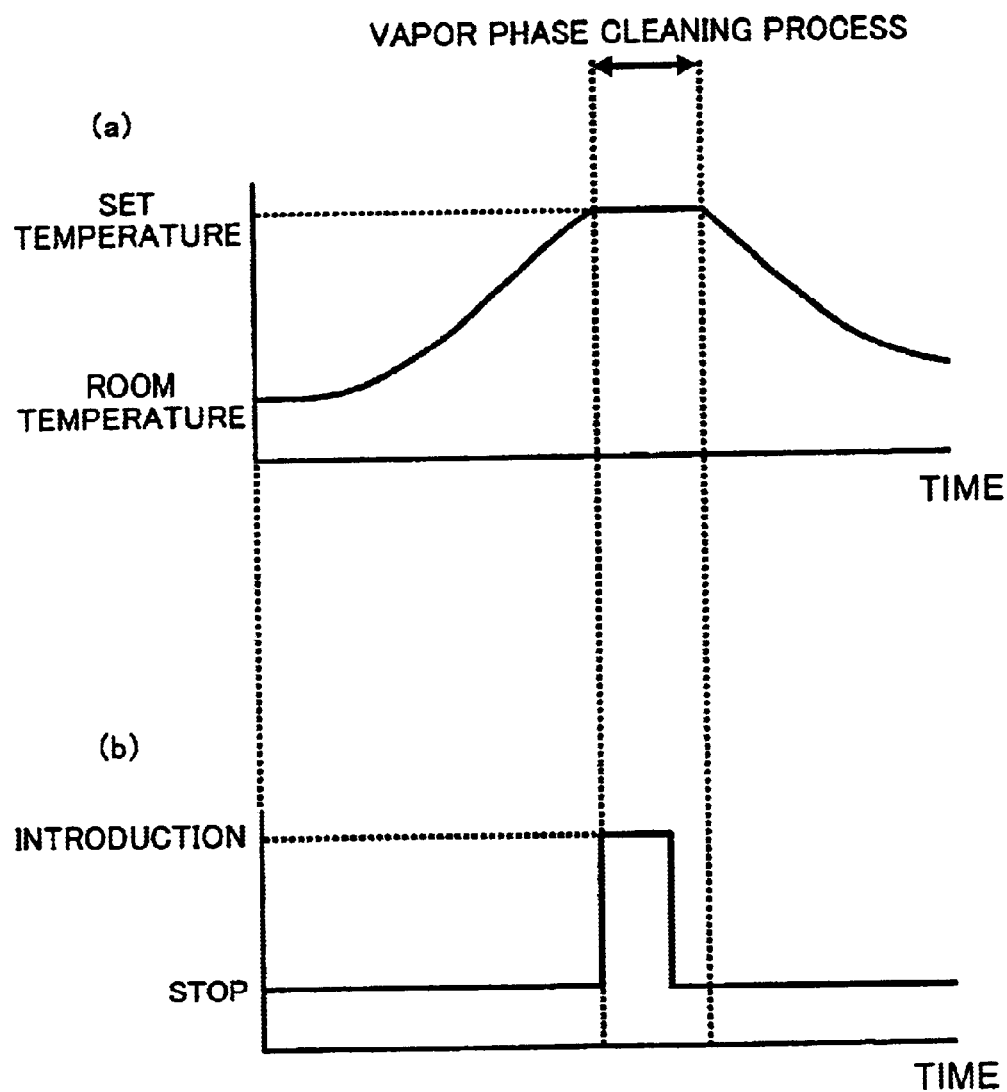
FIG. 2 is a view showing the relation between the temperature of an object to be treated and the time when treating gas is introduced.

Now, a vapor phase cleaning process apparatus used in this embodiment will be described. FIG. 1 is a schematic view of a vapor phase cleaning process apparatus. FIG. 2 is a view showing the relation between the temperature of an object to be treated and the time when treating gas is introduced.

A vapor phase cleaning process apparatus 1 includes a process chamber 3 for performing a vapor phase cleaning process on an object to be treated 2 and a standby chamber 4 adjacent to the process chamber 3. The process chamber 3 and standby chamber 4 are separated by a gate valve 5 which can be opened or closed. An arm 6 for transporting the object to be treated 2 is located in the standby chamber 4 so that the object to be treated 2 can be transported from the standby chamber 4 to the process chamber 3 or from the process chamber 3 to the standby chamber 4. First, the object to be treated 2 on which a vapor phase cleaning process is performed is introduced into the standby chamber 4.

The object to be treated 2 transported from the standby chamber 4 into the process chamber 3 is placed on a process table 7 of silica glass located in it. A heater 8 is located beneath the process table 7 so that it can heat the object to be treated 2 on the process table 7.

Moreover, the process chamber 3 has a treating gas introduction inlet 9 for introducing treating gas which contains carboxylic acid into the process chamber 3, a process chamber gas introduction inlet 10 for introducing inert nitrogen ($N_2$) gas into the process chamber 3, and a process chamber gas discharge outlet 11 for discharging gas in the process chamber 3. The treating gas introduction inlet 9, process chamber gas introduction inlet 10, and process chamber gas discharge outlet 11 are fitted with valves 9a, 10a, and 11a respectively. When the gate valve 5 and all the valves 9a, 10a, and 11a are closed, the process chamber 3 goes into an airtight state.

The standby chamber 4 has a treated object introduction inlet 12 for introducing the object to be treated 2 from the outside into the standby chamber 4, a standby chamber gas introduction inlet 13 for introducing nitrogen gas into the standby chamber 4, and a standby chamber gas discharge outlet 14 for discharging gas in the standby chamber 4. The standby chamber gas introduction inlet 13 and standby chamber gas discharge outlet 14 are fitted with valves 13a and 14a respectively. When the gate valve 5, treated object introduction inlet 12, and valves 13a and 14a are closed, the standby chamber 4 goes into an airtight state.

Carboxylic acid contained in treating gas used for performing a vapor phase cleaning process on the object to be treated 2 is stored in a liquid state in a storage tank 15. Argon (Ar) or helium (He) can be introduced into the storage tank 15. By introducing gas into the storage tank 15, liquid carboxylic acid stored in the storage tank 15 is discharged from the storage tank 15 into a treating gas feed pipe 16 leading to the process chamber 3.

The flow of carboxylic acid discharged from the storage tank 15 into the treating gas feed pipe 16 is adjusted by a mass flow controller 17 located along the treating gas feed pipe 16. A carburetor 18 fitted with a carrier gas introduction inlet 18a for introducing an inert gas and a heater is located on the downstream side of the flow of carboxylic acid from the mass flow controller 17. Carboxylic acid which flows through the treating gas feed pipe 16 is completely vaporized by the carburetor 18. Vaporized carboxylic acid and carrier gas introduced from the carrier gas introduction inlet 18a are mixed in the carburetor 18 and are introduced into the process chamber 3.

The treating gas feed pipe 16 between the carburetor 18 and the process chamber 3 is heated by a heater, such as a ribbon heater or a cylindrical heater, around it to prevent carboxylic acid completely vaporized by the carburetor 18 from condensing in the treating gas feed pipe 16 before being introduced into the process chamber 3.

In the vapor phase cleaning process apparatus 1 having the above structure, the initial state before a cleaning process is as follows. The valves 9a and 10a and the gate valve 5 are closed and the process chamber 3 has been exhausted of gas with an exhaust pump, such as a turbo molecular pump (TMP), so that pressure in the process chamber 3 will be lower than or equal to $10^{-6}$ Pa.

On the other hand, the standby chamber 4 is in an ordinary-pressure state and the treated object introduction inlet 12 and the valves 13a and 14a are in a closed state. If the standby chamber 4 is in a negative-pressure state, then the valve 13a is opened and nitrogen gas is introduced from the standby chamber gas introduction inlet 13 to put the inside of the standby chamber 4 into a ordinary-pressure state.

To perform a vapor phase cleaning process on the object to be treated 2 in the vapor phase cleaning process apparatus 1, the object to be treated 2 is introduced first from the treated object introduction inlet 12 into the standby chamber 4. The treated object introduction inlet 12 is closed, the valve 14a is opened, and the standby chamber 4 is exhausted of gas so that pressure in the standby chamber 4 will be lower than or equal to $10^{-6}$ Pa.

The gate valve 5 is opened and the object to be treated 2 is transported to the process chamber 3 with the arm 6 and is placed on the process table 7. Then the gate valve 5 and valve 11a are closed to make the process chamber 3 airtight and the object to be treated 2 is heated by the heater 8. As shown in FIG. 2(a), the temperature of the object to be treated 2 goes up to a set temperature. As shown in FIG. 2(b), when the temperature of the object to be treated 2 reaches the set temperature, the valve 9a is opened and carboxylic acid, together with carrier gas, which was vaporized by the carburetor 18 is introduced from the treating gas introduction inlet 9 into the process chamber 3. When the treating gas is introduced into the process chamber 3 and pressure in the process chamber 3 reaches a set pressure, the valve 9a is closed and, as shown in FIG. 2(b), the introduction of the treating gas is stopped. The heating of the object to be treated 2 is continued for a predetermined time after the temperature of the object to be treated 2 having reached the set temperature. A vapor phase cleaning process is performed on the object to be treated 2 for this predetermined time. As shown in FIG. 2(a), after the predetermined time elapsed, the heating ends and the object to be treated 2 is left as it is for cooling.

After the vapor phase cleaning process is completed, the valve 11a is opened and the process chamber 3 is exhausted again of gas to make pressure in it lower than or equal to $10^{-6}$ Pa. Then the gate valve 5 is opened and the object to be treated 2 placed on the process table 7 is transported to the standby chamber 4 with the arm 6. If after that a vapor phase cleaning process is performed at once on another object to be treated, this object is transported to the process chamber 3 with the arm 6 and the above process will be repeated.

To take the object to be treated 2 from the standby chamber 4 after the vapor phase cleaning process, nitrogen gas is introduced from the standby chamber gas introduction inlet 13 into the standby chamber 4 for restoring pressure in it. Then the treated object introduction inlet 12 is opened and the object to be treated 2 is taken out.

By flowing only an inert gas and discharging it from a drain 19a with a valve 16a fitted on the treating gas feed pipe 16 close and a valve 16b open, the inside of the mass flow controller 17 can be cleaned.

By flowing only an inert gas and discharging it from a drain 19b with the valves 9a and 16b close and the valve 16a and a valve 16c open, the inside of the carburetor 18 can also be cleaned. Furthermore, by closing the valve 9a and by discharging treating gas from the drain 19b before the treating gas being introduced into the process chamber 3, the flow of the treating gas in which carboxylic acid is completely vaporized and the carboxylic acid content of the treating gas can be kept in a stationary state. When a vapor phase cleaning process is performed, the valve 9a is opened and the valve 16c is closed. This enables a more stable vapor phase cleaning process.

The partial pressure of carboxylic acid at the time of a vapor phase cleaning process being performed after treating gas being introduced into the process chamber 3 is set with the explosion limit concentration of carboxylic acid taken into consideration so that it will be within a range of from 50 to 10,000 Pa. Moreover, the volume percentage of the water or oxygen ($O_2$) content of treating gas introduced should be lower than or equal to 1%. If the water or oxygen ($O_2$) content of treating gas introduced is higher than 1%, there is a possibility that reaction between carboxylic acid and copper oxides does not progress due to a competitive reaction.

Now, an example of a vapor phase cleaning process with the vapor phase cleaning process apparatus 1 will be described. In this example, a vapor phase cleaning process will be performed by the use of a substrate to be treated as the object to be treated 2 shown in FIG. 1. This substrate to be treated is made by forming a copper film on a silicon substrate and by oxidizing the surface of the copper film to form a copper oxide film. This makes it easy to check the effect of a vapor phase cleaning process.

FIGS. 3(a) and 3(b) are simplified views of a section of a substrate to be treated. FIG. 3(a) is a view showing the initial state. FIG. 3(b) is a view showing the state after oxidation.

As shown in FIG. 3(a), a substrate to be treated 20a in the initial state before oxidation has a structure in which a copper film 23 is formed by electroplating on a silicon dioxide film 22 formed on a silicon substrate 21.

The thickness of each of layers included in the substrate to be treated 20a is as follows. The total thickness of the silicon substrate 21 and silicon dioxide film 22 is between about 0.5 and 1 mm. The copper film 23 is about 1,350 nm in thickness and is formed on the silicon dioxide film 22.

The substrate to be treated 20a is put in a 200° C. oven and is heated in the atmosphere for 60 minutes. As a result, as shown in FIG. 3(b), the copper film 23 included in the substrate to be treated 20a is oxidized and a substrate to be treated 20b on which a copper oxide film 24 is formed is obtained. As a result of this atmospheric oxidation, the copper oxide film 24 having a thickness of about 270 nm is formed on the copper film 23 included in the substrate to be treated 20b.

Figure 4:
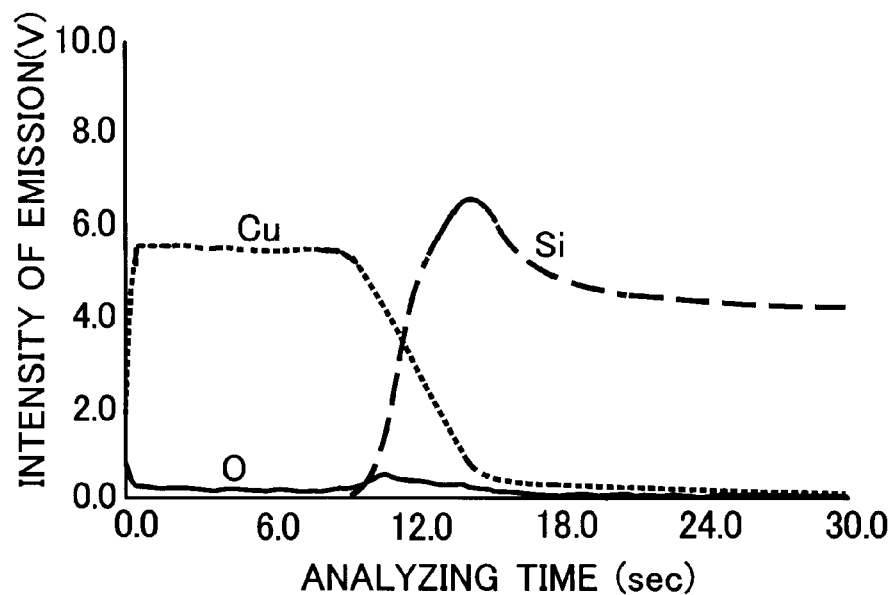
FIGS. 4(a) and 4(b) are graphs showing the results of measurement of a substrate to be treated with a glow discharge spectrometer (GDS), FIG. 4(a) being a graph obtained by measuring the substrate to be treated in the initial state, FIG. 4(b) being a graph obtained by measuring the substrate to be treated after oxidation.
Figure 4:
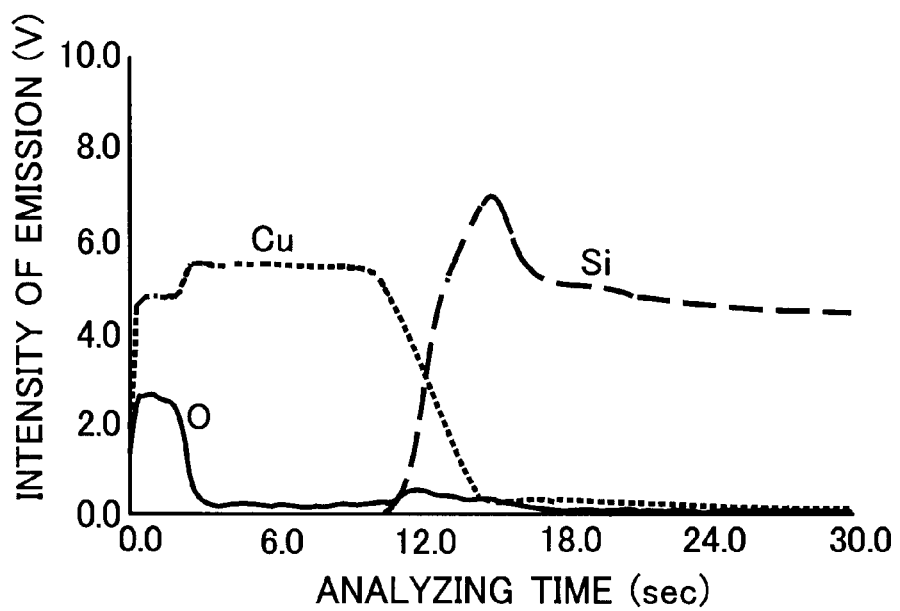

FIGS. 4(a) and 4(b) are graphs showing the results of measurement of a substrate to be treated with a glow discharge spectrometer. FIG. 4(a) is a graph obtained by measuring the substrate to be treated in the initial state. FIG. 4(b) is a graph obtained by measuring the substrate to be treated after oxidation.

The glow discharge spectrometer (GDS) SYSTEM3860, which was manufactured at Rigaku's, is used for analyzing. A high-frequency constant-power mode is used as an analysis mode and the three components of Cu, O, and Si are measured. The diameter of an anode, power, the flow of argon, a sampling interval, and measuring time are 4 mm, 40 W, 200 cc/min., 50 msec, and 30 sec respectively. In this case, a smoothing process (eleven points) was performed on the results of measurement obtained.

Figure 3:
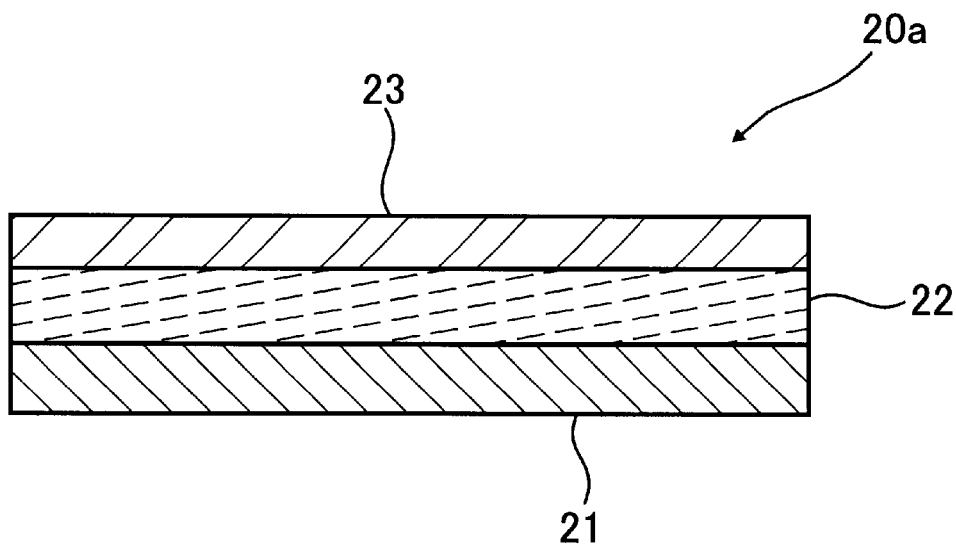
FIGS. 3(a) and 3(b) are simplified views of a section of a substrate to be treated, FIG. 3(a) being a view showing the initial state, FIG. 3(b) being a view showing the state after oxidation.
Figure 3:
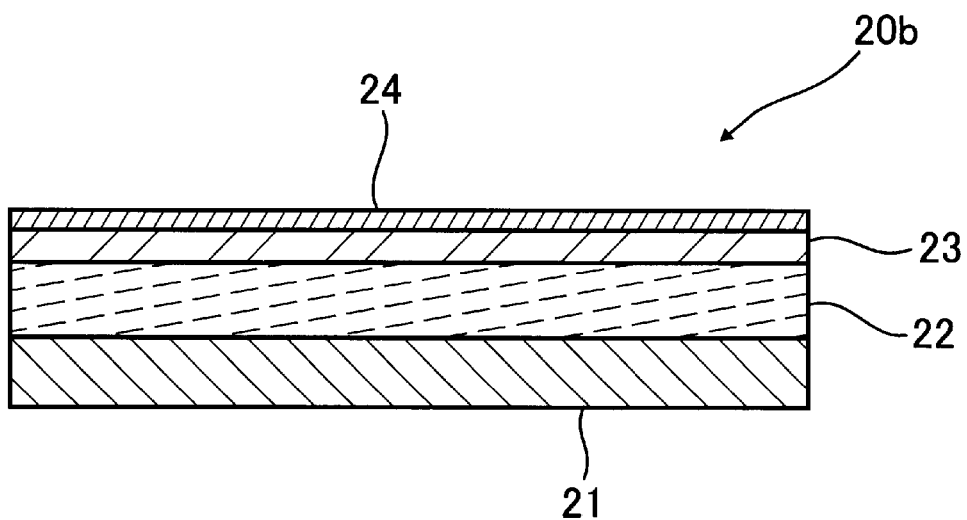

A change in the intensity of emission with respect to time for which the substrates to be treated 20a and 20b shown in FIG. 3 are analyzed is measured. On the graphs in FIG. 4, horizontal axes indicate analyzing time (sec) and vertical axes indicate the intensity of emission (V) with respect to analyzing time for each componential element. In this case, analyzing time in GDS analysis can be converted into the depth of the substrates to be treated 20a and 20b measured and the intensity of emission for each componential element can be converted into its concentration. That is to say, by performing this GDS analysis, information regarding a change in the depth direction in the concentration of an element in the substrates to be treated 20a and 20b can be obtained.

As shown in FIG. 4(a), the Cu component begins to be detected in the substrate to be treated 20a in the initial state from the early stage of analysis. With a reduction in the intensity of emission for the Cu component, the O and Si components begin to be detected. When more analyzing time has elapsed, the Cu and O components are no longer detected. At this time only the Si component is detected. This shows the following. The copper film 23 shown in FIG. 3(a) is detected at the early stage of the analysis. Then the silicon dioxide film 22 beneath the copper film 23 is detected. Finally the silicon substrate 21 is detected.

On the other hand, the results obtained by performing a GDS analysis on the substrate to be treated 20b after atmospheric oxidation are as follows. As shown in FIG. 4(b), the Cu and O components are detected from the early stage of analysis. Then the intensity of emission for the Cu component increases and afterward changes in the same manner as shown in FIG. 4(a). The O component is detected at the early stage of the analysis and then is not detected. Afterward, the intensity of emission for the O component changes in the same manner as shown in FIG. 4(a). The intensity of emission for the Si component also changes in the same manner as shown in FIG. 4(a). This shows that as a result of the atmospheric oxidation, the copper oxide film 24 is formed on the copper film 23 included in the substrate to be treated 20b.

By using the substrate to be treated 20b with the copper oxide film 24 formed on it and the vapor phase cleaning process apparatus 1 shown in FIG. 1, a vapor phase cleaning process with formic acid was performed on the copper oxide film 24. In this case, reduction temperature (temperature of the substrate to be treated), pressure in the process chamber 3, and reducing time were varied.

Figure 5:
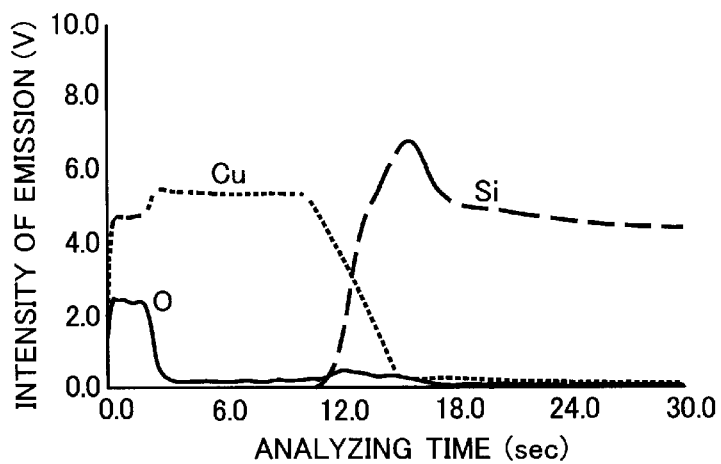
FIGS. 5(a), 5(b), and 5(c) are graphs showing the results of measurement of the substrate to be treated with a GDS after having performed a vapor phase cleaning process at a reduction temperature of 200° C. for three minutes, FIG. 5(a) being a graph obtained when the reduction is performed under a pressure of 100 torr, FIG. 5(b) being a graph obtained when the reduction is performed under a pressure of 200 torr, and FIG. 5(c) being a graph obtained when the reduction is performed under a pressure of 300 torr.
Figure 5:
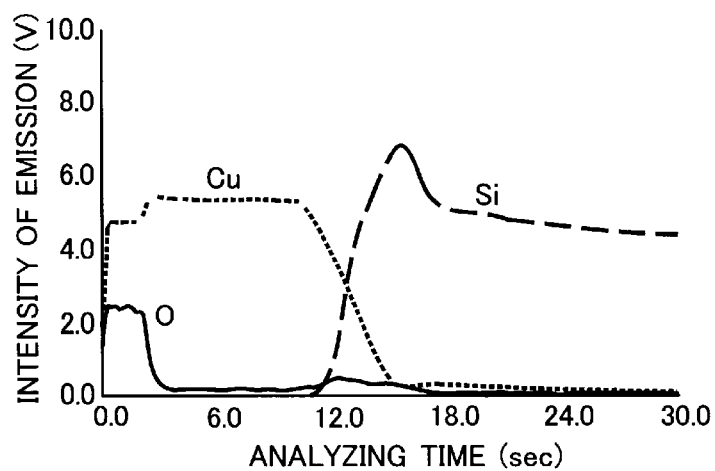
Figure 5:
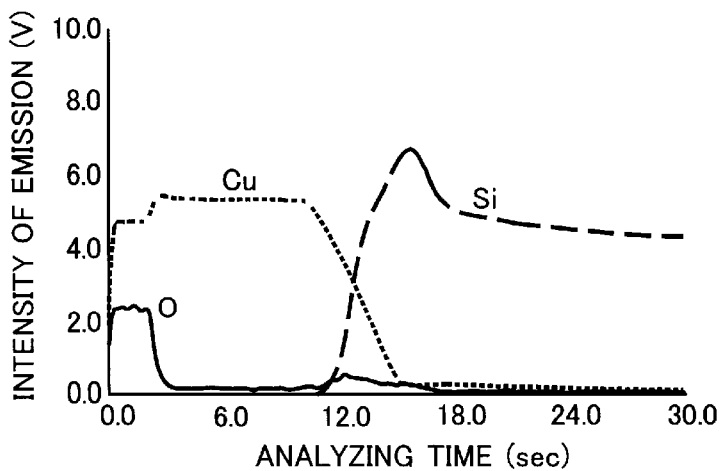

FIGS. 5(a), 5(b), and 5(c) are graphs showing the results of measurement of the substrate to be treated with a GDS after having performed a vapor phase cleaning process at a reduction temperature of 200° C. for three minutes. FIG. 5(a) is a graph obtained when the reduction is performed under a pressure of 100 torr. FIG. 5(b) is a graph obtained when the reduction is performed under a pressure of 200 torr. FIG. 5(c) is a graph obtained when the reduction is performed under a pressure of 300 torr.

As shown in FIG. 5(a), if a vapor phase cleaning process is performed at a reduction temperature of 200° C. under a pressure in the process chamber 3 shown in FIG. 1 of 100 torr, the O component is detected from the early stage of the analysis. This shows that the copper oxide film 24 still remains on the substrate to be treated 20b. That is to say, compared with the results of measurement with a GDS shown in FIG. 4(b), there is little change.

As shown in FIG. 5(b) or 5(c), if the pressure in the process chamber 3 is increased to 200 or 300 torr and the amount of formic acid in the process chamber 3 is increased, there is little change in the results of measurement with a GDS. Therefore, if a vapor phase cleaning process is performed at a reduction temperature of 200° C., the copper oxide film 24 on the substrate to be treated 20b shown in FIG. 3(b) cannot be reduced.

Figure 6:
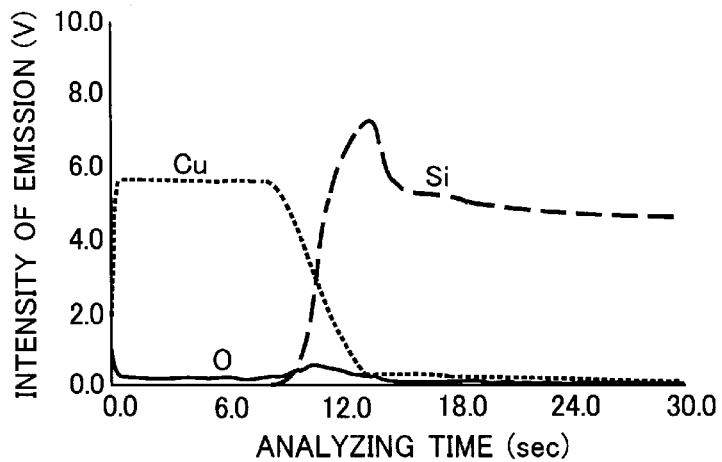
FIGS. 6(a), 6(b), and 6(c) are graphs showing the results of measurement of the substrate to be treated with a GDS after having performed a vapor phase cleaning process for three minutes at a reduction temperature of 300° C., FIG. 6(a) being a graph obtained when the reduction is performed under a pressure of 100 torr, FIG. 6(b) being a graph obtained when the reduction is performed under a pressure of 200 torr, and FIG. 6(c) being a graph obtained when the reduction is performed under a pressure of 300 torr.
Figure 6:
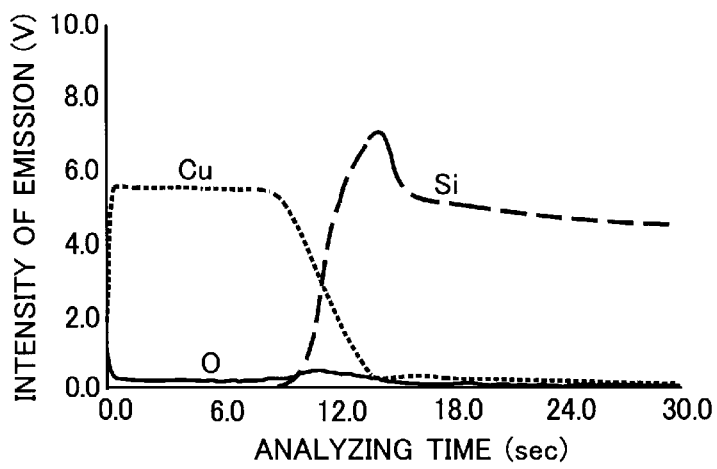
Figure 6:
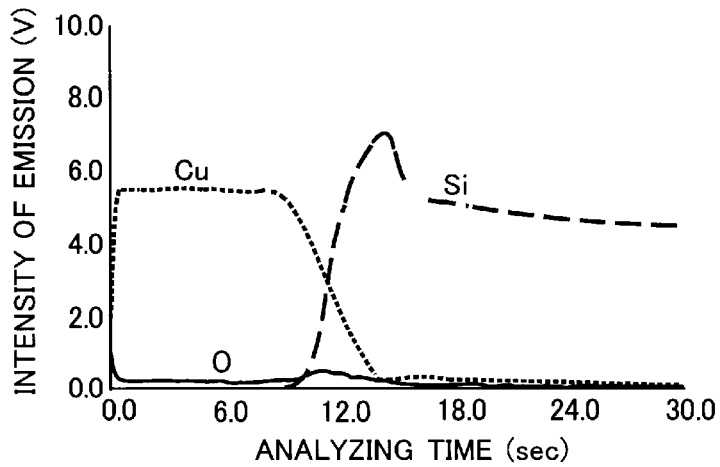

FIGS. 6(a), 6(b), and 6(c) are graphs showing the results of measurement of the substrate to be treated with a GDS after having performed a vapor phase cleaning process at a reduction temperature of 300° C. for three minutes. FIG. 6(a) is a graph obtained when the reduction is performed under a pressure of 100 torr. FIG. 6(b) is a graph obtained when the reduction is performed under a pressure of 200 torr. FIG. 6(c) is a graph obtained when the reduction is performed under a pressure of 300 torr.

As shown in FIG. 6(a), if a vapor phase cleaning process is performed at a reduction temperature of 300° C. under a pressure in the process chamber 3 shown in FIG. 1 of 100 torr, the Cu component is detected from the early stage of the analysis and the O component is not detected at this stage. With a reduction in the intensity of emission for the Cu component, the O component begins to be detected. This is almost the same as the results of measurement of the substrate to be treated 20a in the initial state with a GDS shown in FIG. 4(a).

Similarly, as shown in FIG. 6(b) or 6(c), if the pressure in the process chamber 3 is increased to 200 or 300 torr and the amount of formic acid in the process chamber 3 is increased, the O component is not detected at the early stage of the analysis. Therefore, if a vapor phase cleaning process is performed at a reduction temperature of 300° C., the copper oxide film 24 on the substrate to be treated 20b shown in FIG. 3(b) can be reduced.

Figure 7:
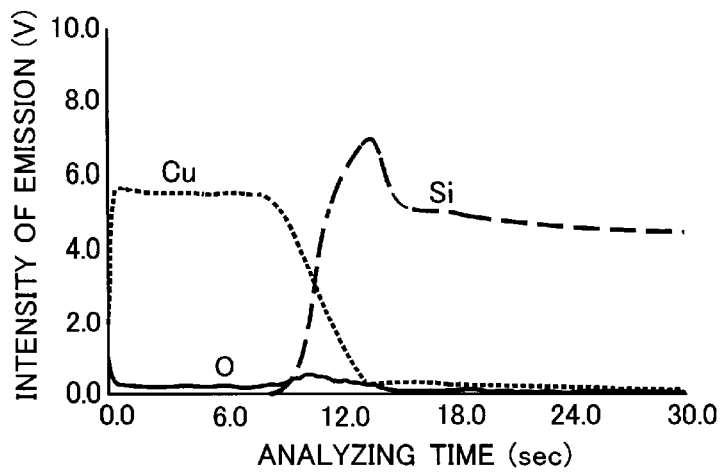
FIGS. 7(a), 7(b), and 7(c) are graphs showing the results of measurement of the substrate to be treated with a GDS after having performed a vapor phase cleaning process at a reduction temperature of 400° C. for three minutes, FIG. 7(a) being a graph obtained when the reduction is performed under a pressure of 100 torr, FIG. 7(b) being a graph obtained when the reduction is performed under a pressure of 200 torr, and FIG. 7(c) being a graph obtained when the reduction is performed under a pressure of 300 torr.
Figure 7:
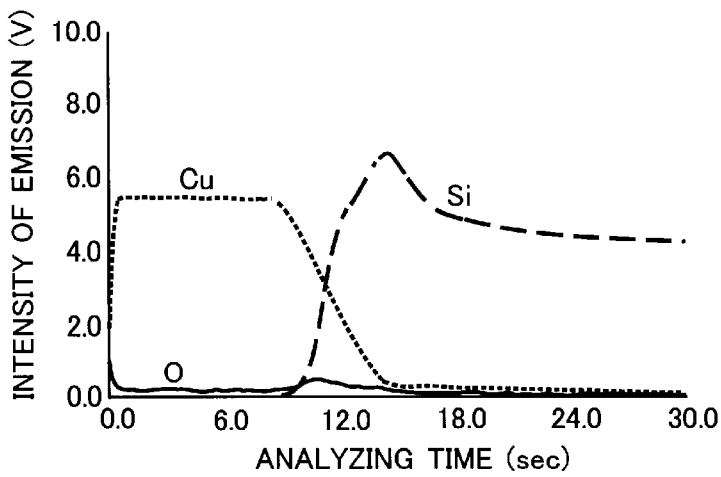
Figure 7:
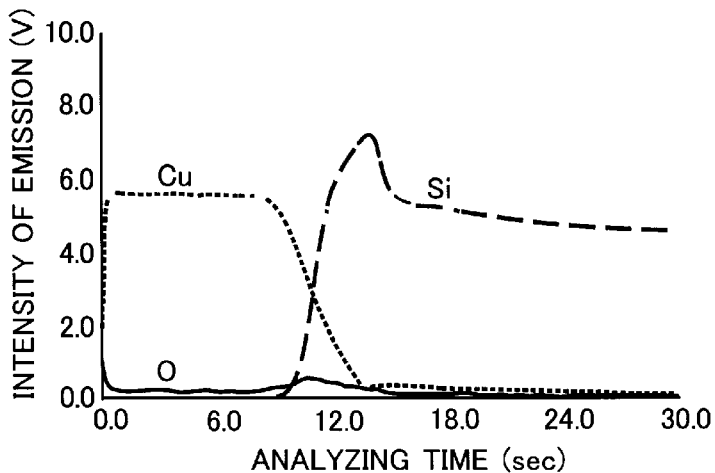

FIGS. 7(a), 7(b), and 7(c) are graphs showing the results of measurement of the substrate to be treated with a GDS after having performed a vapor phase cleaning process at a reduction temperature of 400° C. for three minutes. FIG. 7(a) is a graph obtained when the reduction is performed under a pressure of 100 torr. FIG. 7(b) is a graph obtained when the reduction is performed under a pressure of 200 torr. FIG. 7(c) is a graph obtained when the reduction is performed under a pressure of 300 torr.

As shown in FIG. 7(a), if a vapor phase cleaning process is performed at a reduction temperature of 400° C. under a pressure in the process chamber 3 shown in FIG. 1 of 100 torr, the Cu component is detected from the early stage of the analysis and the O component is not detected. This shows that the copper oxide film 24 on the substrate to be treated 20b shown in FIG. 3(b) has been reduced.

Similarly, as shown in FIG. 7(b) or 7(c), if the pressure in the process chamber 3 is increased to 200 or 300 torr, the O component is not detected at the early stage of the analysis. Therefore, by performing a vapor phase cleaning process at a reduction temperature of 400° C., the copper oxide film 24 on the substrate to be treated 20b shown in FIG. 3(b) can be reduced.

Figure 8:
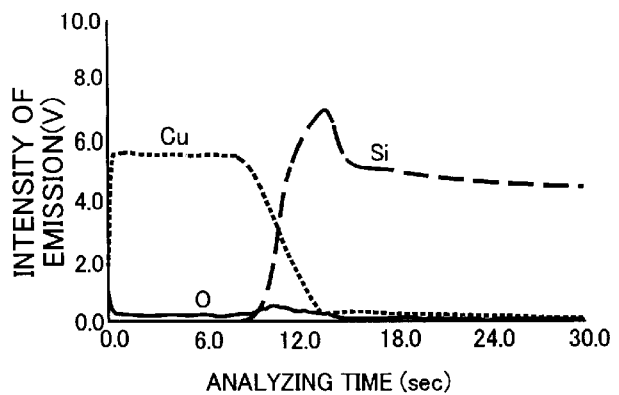
FIGS. 8(a), 8(b), 8(c), and 8(d) are graphs showing the results of measurement of the substrate to be treated with a GDS after having performed a vapor phase cleaning process at a reduction temperature of 400° C. for one minute, FIG. 8(a) being a graph obtained when the reduction is performed under a pressure of 100 torr, FIG. 8(b) being a graph obtained when the reduction is performed under a pressure of 200 torr, FIG. 8(c) being a graph obtained when the reduction is performed under a pressure of 300 torr, and FIG. 8(d) being a graph obtained when the reduction is performed under a pressure of 400 torr.
Figure 8:
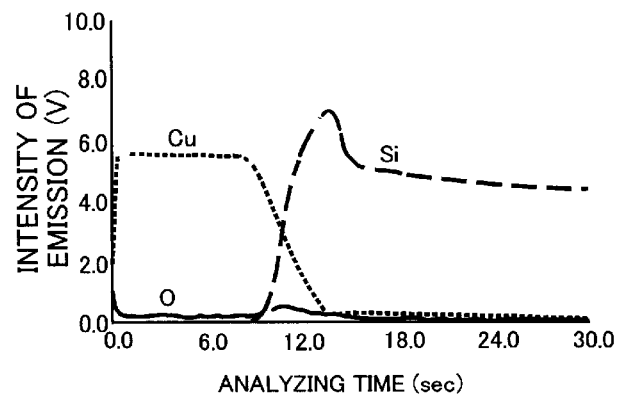
Figure 8:
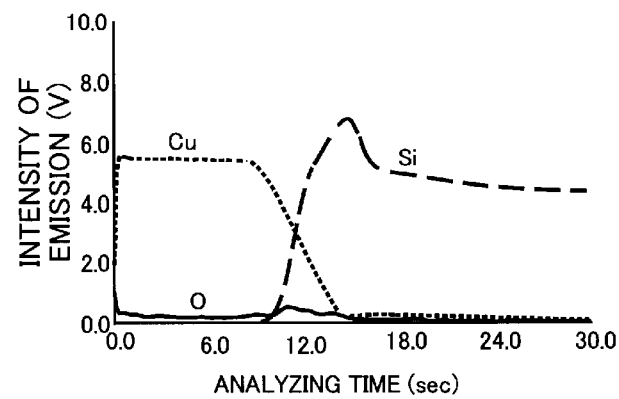
Figure 8:
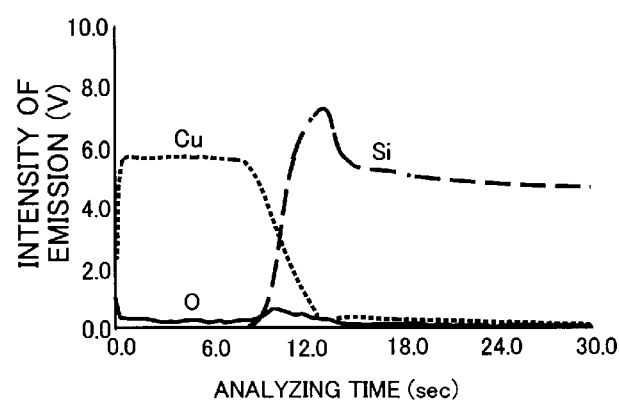

FIGS. 8(a), 8(b), 8(c), and 8(d) are graphs showing the results of measurement of the substrate to be treated with a GDS after having performed a vapor phase cleaning process at a reduction temperature of 400° C. for one minute. FIG. 8(a) is a graph obtained when the reduction is performed under a pressure of 100 torr. FIG. 8(b) is a graph obtained when the reduction is performed under a pressure of 200 torr. FIG. 8(c) is a graph obtained when the reduction is performed under a pressure of 300 torr. FIG. 8(d) is a graph obtained when the reduction is performed under a pressure of 400 torr.

As shown in FIG. 8(a), even if a vapor phase cleaning process is performed at a reduction temperature of 400° C. under a pressure in the process chamber 3 shown in FIG. 1 of 100 torr and reducing time is shortened from three minutes to one minute, the Cu component is detected from the early stage of the analysis and the O component is not detected. This shows that the copper oxide film 24 on the substrate to be treated 20b shown in FIG. 3(b) has been reduced.

Similarly, as shown in FIGS. 8(b), 8(c), or 8(d), if the pressure in the process chamber 3 is increased to 200, 300, or 400 torr, the O component is not detected at the early stage of the analysis. Therefore, even if reducing time is shortened, the copper oxide film 24 on the substrate to be treated 20b shown in FIG. 3(b) can be reduced by performing a vapor phase cleaning process at a reduction temperature of 400° C.

If reduction temperature is lower than 250° C., a sufficient reaction rate cannot be obtained in a reducing reaction which will occur during a vapor phase cleaning process. Moreover, if reduction temperature is higher than 400° C., the growth of copper crystal granules will be promoted and the surface of copper may become irregular. Therefore, 400° C. will be a practical upper limit for a vapor phase cleaning process.

If reduction temperature is between 250 and 400° C., then a sufficient reaction rate can be obtained. As a result, even if reducing time is set to a short period of time, such as one or three minutes, a reducing reaction will occur. Therefore, a vapor phase cleaning process can be performed efficiently. Furthermore, time for which the substrates to be treated 20a and 20b are exposed to a high temperature is shortened. This prevents the surface of copper from becoming irregular during a vapor phase cleaning process.

As described above, during a process for producing semiconductor devices, a vapor phase cleaning process for reducing copper oxides produced on copper which forms electrodes and wirings by the use of gaseous carboxylic acid is performed. In this case, the partial pressure of carboxylic acid in a process chamber is between 50 and 10,000 Pa, reduction temperature is between 250 and 400° C., total pressure is between 100 and 300 torr, and reducing time is three minutes. If reduction temperature is 400° C., total pressure is between 100 and 400 torr and reducing time is one minute. By performing a vapor phase cleaning process under these reaction conditions, copper oxides can be reduced uniformly without the surfaces of electrodes and wirings being made irregular. In addition, a vapor phase cleaning process can be performed with reducing time shortened.

Moreover, carbon dioxide and water produced as a result of a vapor phase cleaning process according to the present invention are gaseous under the above reaction conditions, so they do not remain as impurities after the vapor phase cleaning process. This makes it unnecessary to perform the conventional process during which water vapor is used. Therefore, semiconductor devices having stable characteristics can be produced without processes after a vapor phase cleaning process being influenced.

In the above descriptions the vapor phase cleaning process apparatus 1 shown in FIG. 1 includes only the heater 8 located in the process chamber 3 as a mechanism for heating the object to be treated 2. However, a vapor phase cleaning process apparatus which can perform a vapor phase cleaning process while applying ultraviolet (UV) to the object to be treated 2 can be used.

Figure 9:
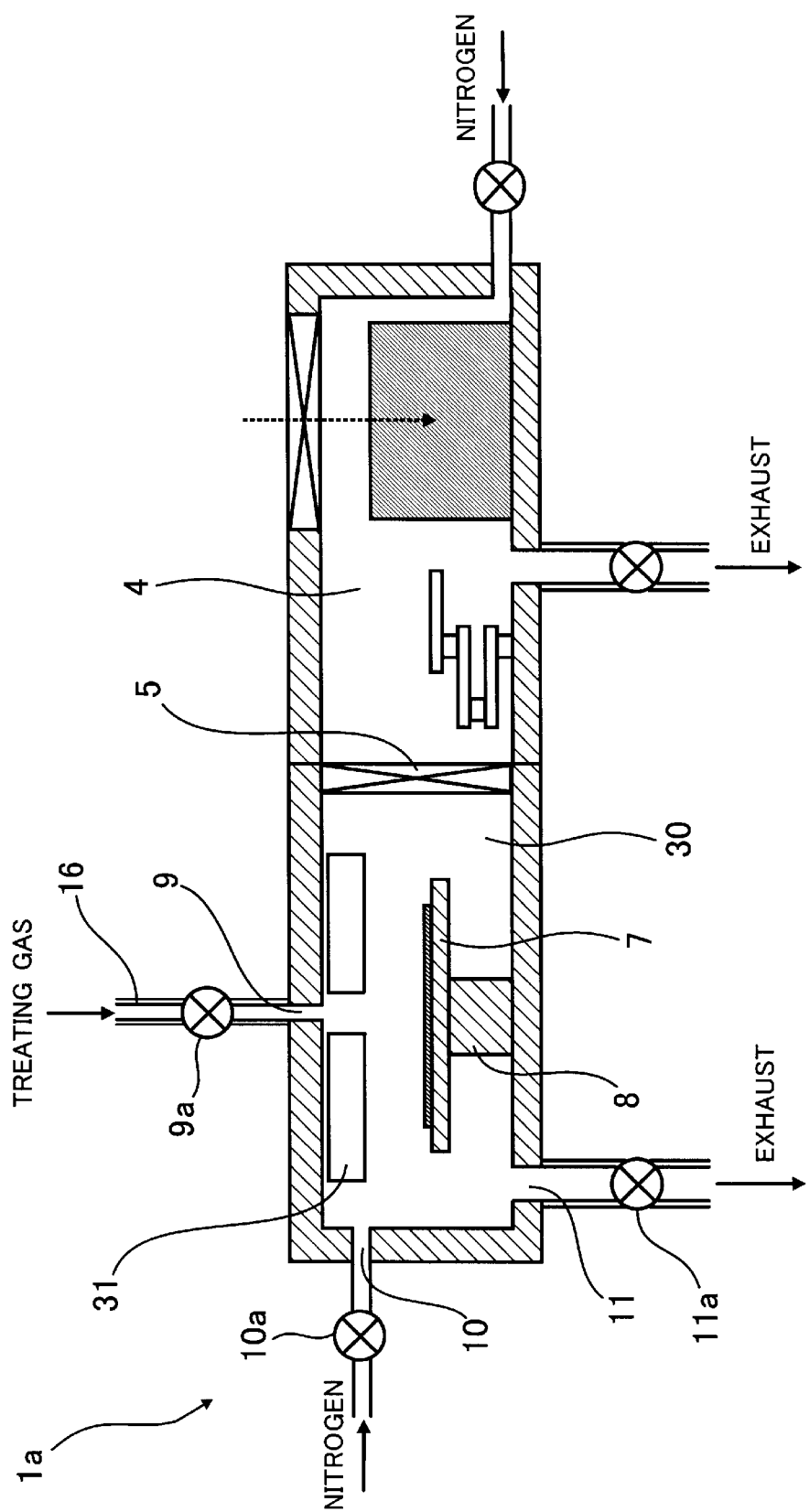
FIG. 9 is a schematic longitudinal sectional view of a process chamber and standby chamber in a vapor phase cleaning process apparatus which can apply ultraviolet.
Figure 10:
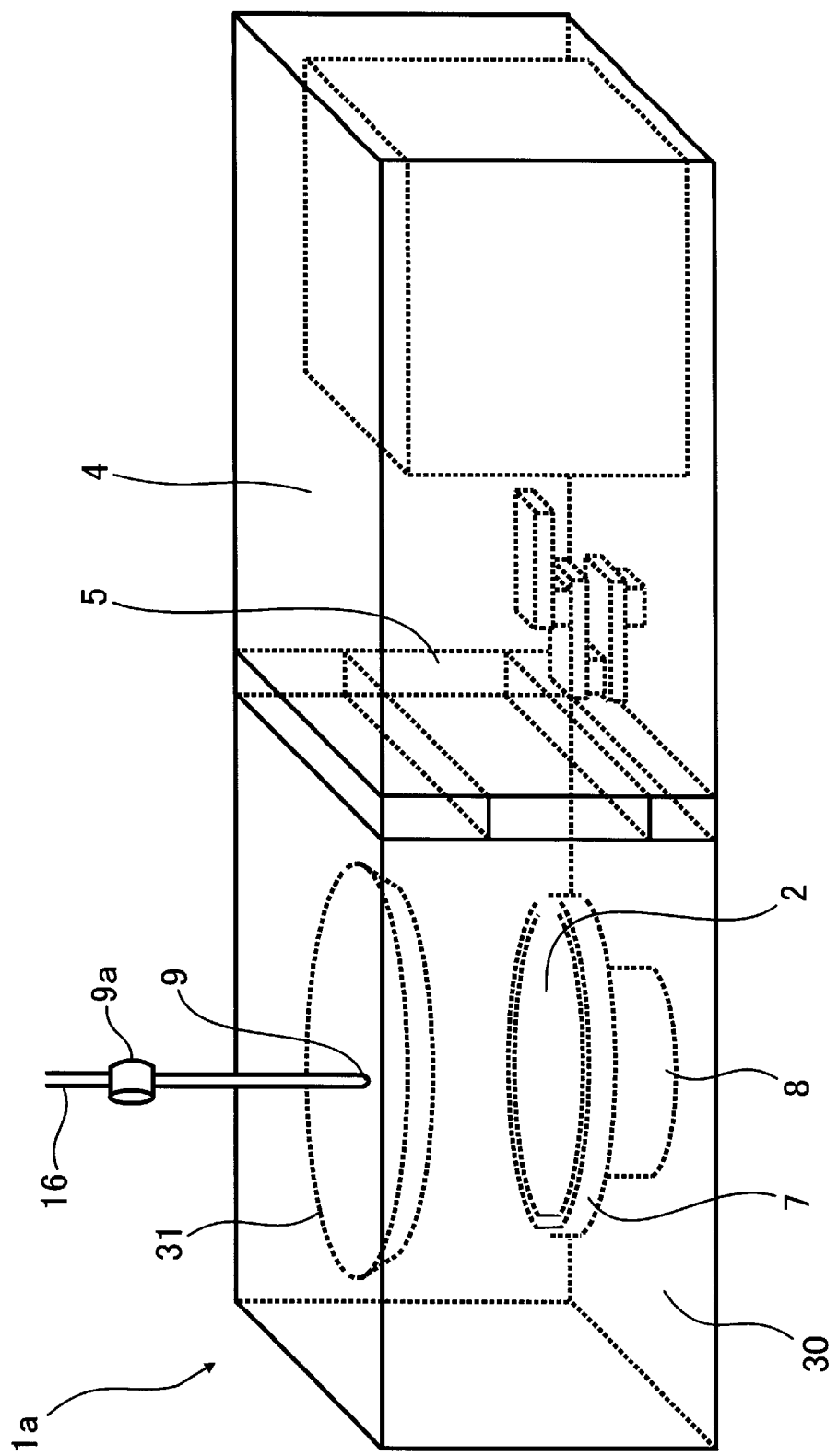
FIG. 10 is a schematic perspective view of the process chamber and standby chamber in the vapor phase cleaning process apparatus which can apply ultraviolet.

FIG. 9 is a schematic longitudinal sectional view of a process chamber and standby chamber in a vapor phase cleaning process apparatus which can apply UV. FIG. 10 is a schematic perspective view of the process chamber and standby chamber in the vapor phase cleaning process apparatus which can apply UV. Components which are the same as those of the vapor phase cleaning process apparatus 1 shown in FIG. 1 are marked with the same symbols and detailed descriptions of them will be omitted.

As shown in FIGS. 9 and 10, a vapor phase cleaning process apparatus 1a being able to apply UV to the object to be treated 2 on which a vapor phase cleaning process is performed includes a process chamber 30 and standby chamber 4 which is separated by a gate valve 5. The process chamber 30 includes a process table 7 on which the object to be treated 2 is placed and a heater 8 and has a treating gas introduction inlet 9 fitted with a valve 9a, a process chamber gas introduction inlet 10 fitted with a valve 10a, and a process chamber gas discharge outlet 11 fitted with a valve 11a. Treating gas which flows through a treating gas feed pipe 16 is introduced from the treating gas introduction inlet 9 into the process chamber 30.

The process chamber 30 includes a discal UV lamp 31 located opposite to the process table 7. A hole the position of which corresponds to the treating gas introduction inlet 9 is made in the UV lamp 31. When a vapor phase cleaning process is performed, UV can be applied to the entire surface of the object to be treated 2 placed on the process table 7.

By applying UV to the object to be treated 2 in this way, the reaction by carboxylic acid of reducing copper oxides is promoted. As a result, a reaction rate increases and a vapor phase cleaning process can be performed more efficiently.

Moreover, by combining an apparatus for a CVD or PVD process with the above vapor phase cleaning process apparatus 1 or 1a, a vapor phase cleaning process and a CVD or PVD process can be performed consecutively.

Figure 11:
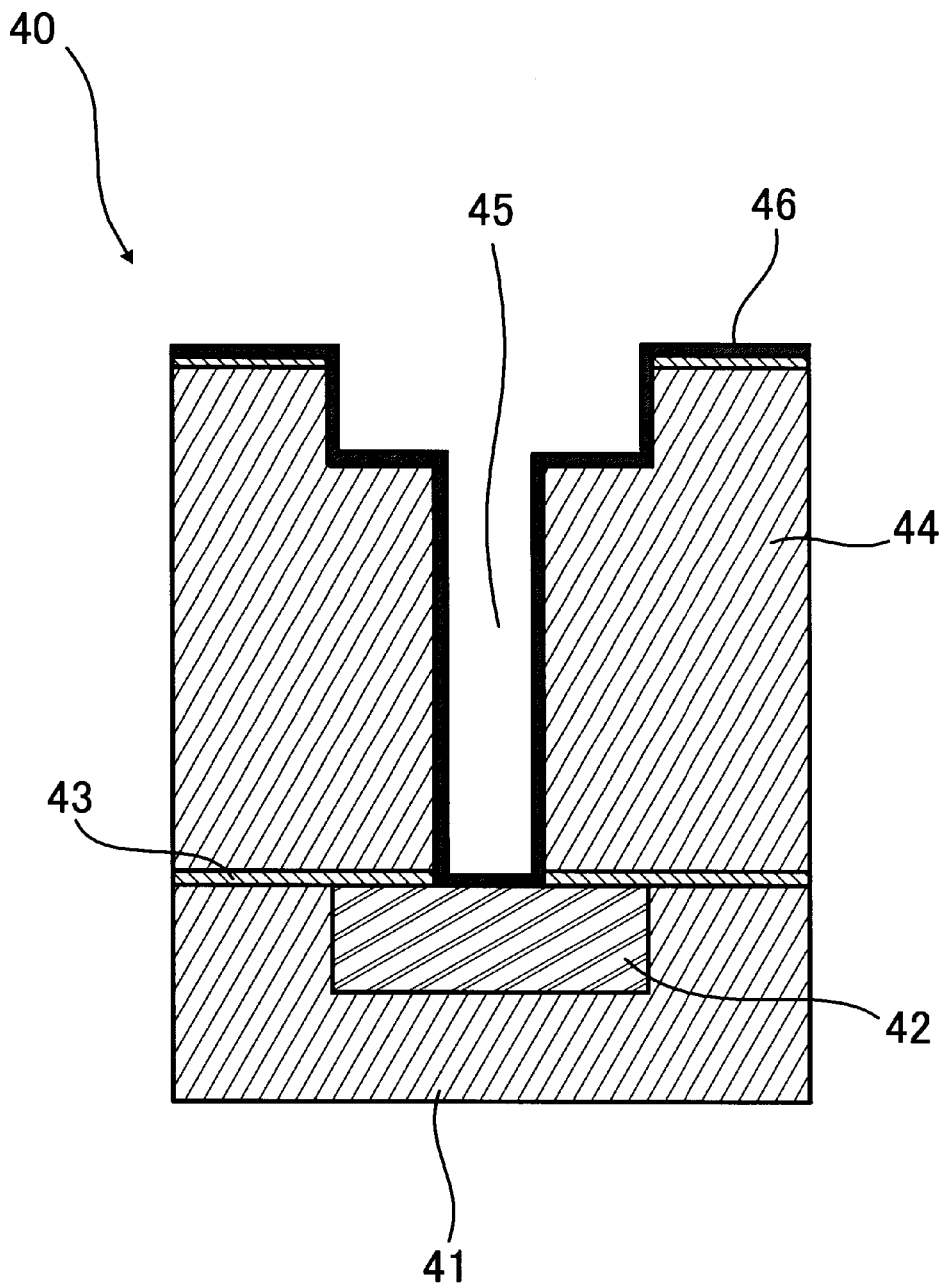
FIG. 11 is a sectional view of a semiconductor device being in the process of being manufactured.

FIG. 11 is a sectional view of a semiconductor device being in the process of being manufactured. A lower layer wiring 42 of copper formed by a damascene method is formed in a first insulating layer 41 of silicon dioxide in a semiconductor device 40. After the lower layer wiring 42 is formed, silicon nitride, silicon carbide (SiC), or the like is deposited by CVD to form an etch stopper 43. A second insulating layer 44 is formed on the etch stopper 43. Portions of the second insulating layer 44 and the etch stopper 43 formed beneath it where a via hole 45, which leads to the lower layer wiring 42, is to be formed are removed by etching.

A conductor 46, such as titanium nitride (TiN), is deposited by PVD on the surface of the lower layer wiring 42 which got exposed by the etching in order to prevent copper which forms the lower layer wiring 42 from oxidizing.

If a vapor phase cleaning process and PVD process can be performed consecutively, etching is performed first so that the lower layer wiring 42 will get exposed, then the exposed surface is cleaned by performing a vapor phase cleaning process, and then the conductor 46 is deposited. After that copper, being a material for electrodes, is embedded in the via hole 45. By doing so, electrical reliability between the lower layer wiring 42 and copper embedded in the via hole 45 is no longer degraded and semiconductor devices having stable characteristics can be produced efficiently.

Figure 12:
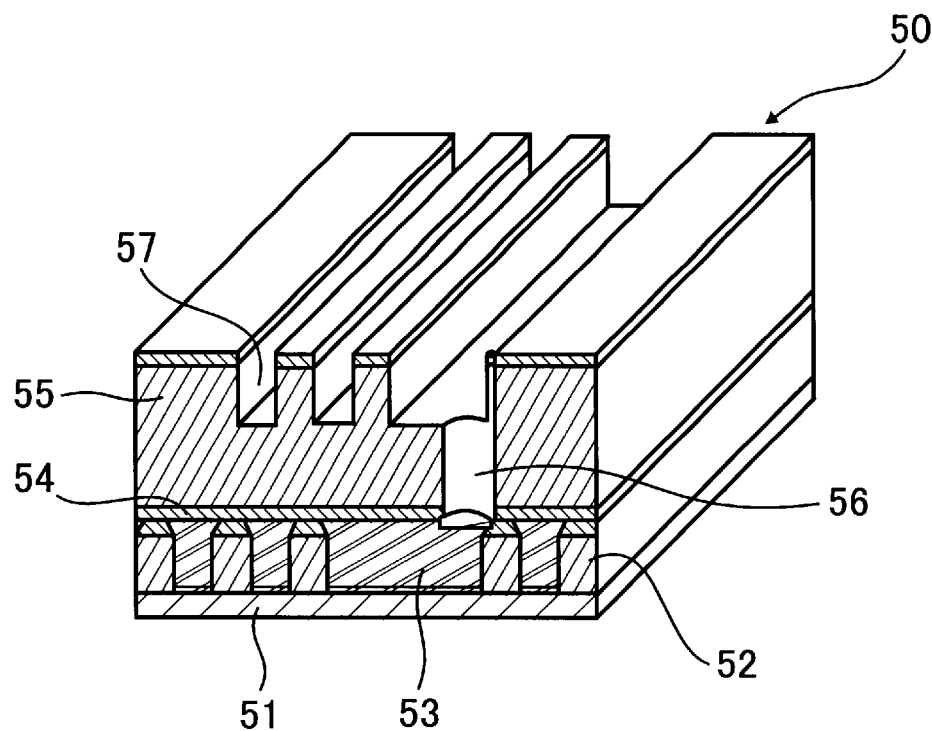
FIGS. 12(a) and 12(b) are sectional views of a semiconductor device being in the process of being manufactured, FIG. 12(a) being a sectional view showing the state after etching, FIG. 12(b) being a sectional view showing the state after copper being embedded in an electrode and wiring.
Figure 12:
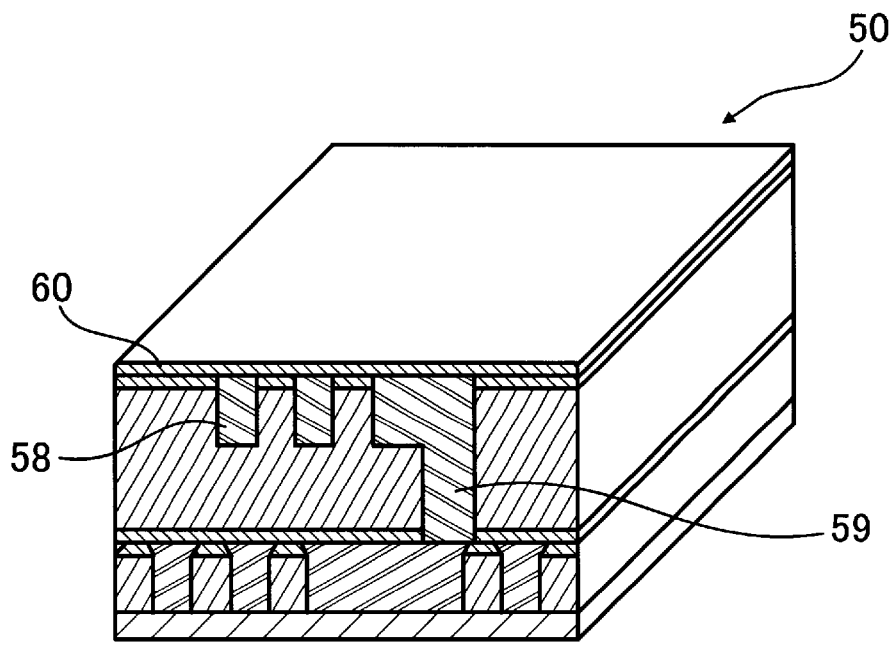

FIGS. 12(a) and 12(b) are sectional views of a semiconductor device being in the process of being manufactured. FIG. 12(a) is a sectional view showing the state after etching. FIG. 12(b) is a sectional view showing the state after copper being embedded in an electrode and wiring.

As shown in FIG. 12(a), a lower layer wiring 53 of copper formed by a damascene method is formed in a first insulating layer 52 of silicon dioxide formed on a silicon wafer 51 in a semiconductor device 50. After the lower layer wiring 53 is formed, silicon nitride, silicon carbide, or the like is deposited by CVD to form a first etch stopper 54. A second insulating layer 55 is formed on the first etch stopper 54.

A via hole 56 which leads to the lower layer wiring 53 and a trench 57 for a wiring are formed in the second insulating layer 55. Portions of the second insulating layer 55 and the first etch stopper 54 formed beneath it where the via hole 56 is to be formed are removed by etching. After the lower layer wiring 53 gets exposed by this etching, copper, being a material for electrodes, is embedded in the via hole 56 and trench 57 to form a wiring 58 and buried electrode 59 as shown in FIG. 12(b). Their surfaces are planarized by a CMP process. In order to prevent the embedded copper from oxidizing and diffusing, the whole of the upper surface of the semiconductor device 50 is coated with a second etch stopper 60 formed by CVD.

If a vapor phase cleaning process and CVD process can be performed consecutively, copper is embedded in the via hole 56 and trench 57, a CMP process is performed, the surface of the copper is cleaned by performing a vapor phase cleaning process, and then the whole of the upper surface of the semiconductor device 50 is coated with the second etch stopper 60. As a result, the surface of copper which forms electrodes and wirings does not become irregular and the second etch stopper 60 can be formed on a planar copper surface. Therefore, local degradation of a coating of the second etch stopper 60 can be avoided.

A vapor phase cleaning process performed in the case of copper being used as a material for electrodes and wirings formed on a semiconductor device has been described. However, the vapor phase cleaning process according to the present invention is also applicable to the production of semiconductor devices in which a metal other than copper, such as aluminum or silver, widely used at present is used or in which a metallic material made up mainly of copper is used.

As has been described in the foregoing, in the present invention, the vapor phase cleaning process for reducing metal oxides produced on metal which forms electrodes or wirings on a semiconductor device to metal by the use of gaseous carboxylic acid is performed. As a result, metal oxides can be reduced uniformly without making the surfaces of electrodes or wirings irregular.

Moreover, with the vapor phase cleaning process according to the present invention, carbon dioxide and water being by-products of a reducing reaction are produced in a gaseous state. This prevents impurities from remaining on the surface of copper.

Furthermore, by performing the vapor phase cleaning process with ultraviolet being applied to metal oxides, reduction temperature can be lowered. As a result, exposure to a high temperature at which the surface of metal will become irregular can be avoided. In addition, by properly selecting a kind of carboxylic acid to be used for a vapor phase cleaning process, reduction temperature can also be lowered.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device for performing a cleaning process to reduce metal oxides produced on metal which forms electrodes or wirings on a semiconductor device, the method comprising the step of performing a vapor phase cleaning process to reduce the metal oxides to metal and produce gaseous carbon dioxide and water by introducing gaseous carboxylic acid into a process chamber in which the semiconductor device is located, wherein said step of performing a vapor phase cleaning process to reduce the metal oxides comprises applying ultraviolet to the metal oxides.

2. A method of manufacturing a semiconductor device according to claim 1, wherein following the reduction of the metal oxides in the vapor phase cleaning process, a reduced surface is coated with a conductor.

3. A method of manufacturing a semiconductor device for performing a cleaning process to reduce metal oxides produced on metal which forms electrodes or wirings on a semiconductor device, the method comprising the step of performing a vapor phase cleaning process to reduce the metal oxides to metal and produce gaseous carbon dioxide and water by introducing gaseous carboxylic acid into a process chamber in which the semiconductor device is located, wherein the carboxylic acid is one of formic acid, acetic acid, propionic acid, and butyric acid, and wherein the carboxylic acid contains one or more chlorine or fluorine atoms as a component.

4. A method of manufacturing a semiconductor device for performing a cleaning process to reduce metal oxides produced on metal which forms electrodes or wirings on a semiconductor device, the method comprising the step of performing a vapor phase cleaning process to reduce the metal oxides to metal and produce gaseous carbon dioxide and water by introducing gaseous carboxylic acid into a process chamber in which the semiconductor device is located, wherein the carboxylic acid is mixed with an inert gas and comes into contact with the metal oxides in a gaseous state, wherein the volume percentage of the water content of a mixture of the carboxylic acid which comes into contact with the metal oxides in a gaseous state and the inert gas is lower than or equal to 1%.

5. A method of manufacturing a semiconductor device for performing a cleaning process to reduce metal oxides produced on metal which forms electrodes or wirings on a semiconductor device, the method comprising the step of performing a vapor phase cleaning process to reduce the metal oxides to metal and produce gaseous carbon dioxide and water by introducing gaseous carboxylic acid into a process chamber in which the semiconductor device is located, wherein the carboxylic acid is mixed with an inert gas and comes into contact with the metal oxides in a gaseous state, wherein the volume percentage of the oxygen content of a mixture of the carboxylic acid which comes into contact with the metal oxides in a gaseous state and the inert gas is lower than or equal to 1%.

* * * * *